(12) United States Patent
Young et al.

(10) Patent No.: US 6,767,692 B1
(45) Date of Patent: Jul. 27, 2004

(54) PROCESS FOR INHIBITING EDGE PEELING OF COATING ON SEMICONDUCTOR SUBSTRATE DURING FORMATION OF INTEGRATED CIRCUIT STRUCTURE THEREON

(75) Inventors: Roger Young, Vancouver, WA (US); Ann Kang, Portland, OR (US); Bruce Whitefield, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 190 days.

(21) Appl. No.: 09/997,071

(22) Filed: Nov. 28, 2001

(51) Int. Cl.[7] .............................. G03F 7/00; G03C 5/00

(52) U.S. Cl. .................... 430/311; 430/312; 430/313; 430/322; 430/30; 427/96; 427/145; 427/240; 356/237.4; 356/237.6

(58) Field of Search .......................... 430/30, 311, 312, 430/313, 322; 356/237.4, 237.5, 237.6; 427/96, 145, 240

(56) References Cited

U.S. PATENT DOCUMENTS

| | | | |
|---|---|---|---|
| 4,518,678 A | | 5/1985 | Allen .......................... 430/311 |
| 5,723,385 A | * | 3/1998 | Shen et al. .................. 438/763 |
| 6,432,620 B1 | * | 8/2002 | Arao ........................... 430/322 |

* cited by examiner

Primary Examiner—Mark F. Huff
Assistant Examiner—Kripa Sagar
(74) Attorney, Agent, or Firm—John P. Taylor

(57) ABSTRACT

A photoresist-free and ARC-free lip on the periphery of the upper surface of a semiconductor substrate adjacent the end edge of the substrate is formed by the steps of: forming an ARC layer on one surface of a semiconductor substrate; chemically treating the ARC layer to chemically terminate the ARC layer a first distance from the end edge of the substrate; forming a photoresist layer over the semiconductor substrate and over the ARC layer thereon; and exposing the peripheral portion of the photoresist layer to UV light followed by development of the exposed peripheral portion of the photoresist layer to photolithographically terminate the photoresist layer a second distance from the end edge of the substrate wherein the second distance is smaller than the first distance.

12 Claims, 2 Drawing Sheets

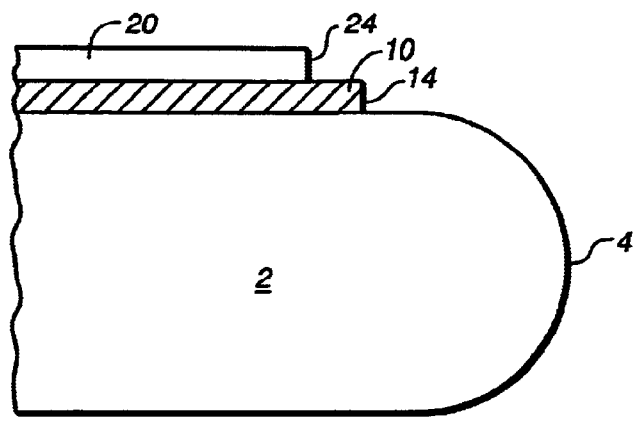
FIG._1
*(PRIOR ART)*
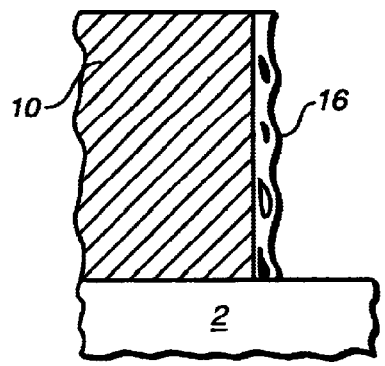
FIG._2
*(PRIOR ART)*
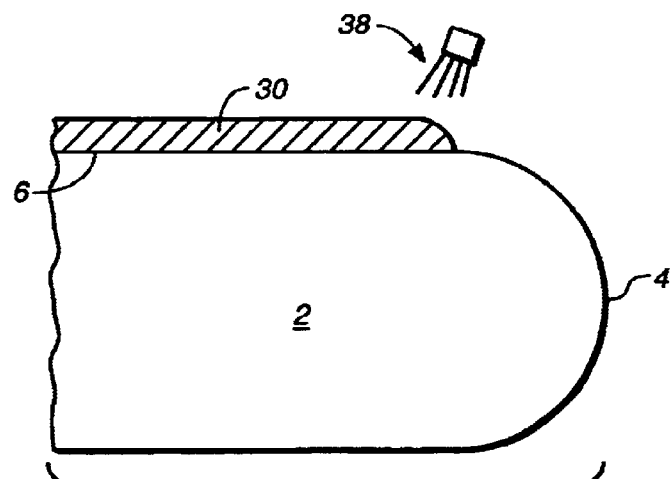
FIG._3

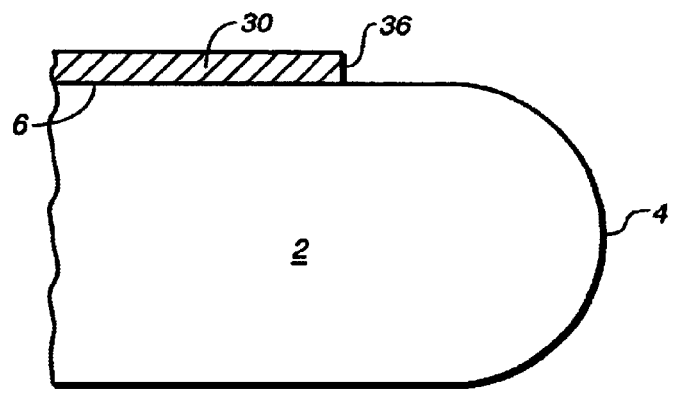
FIG._4
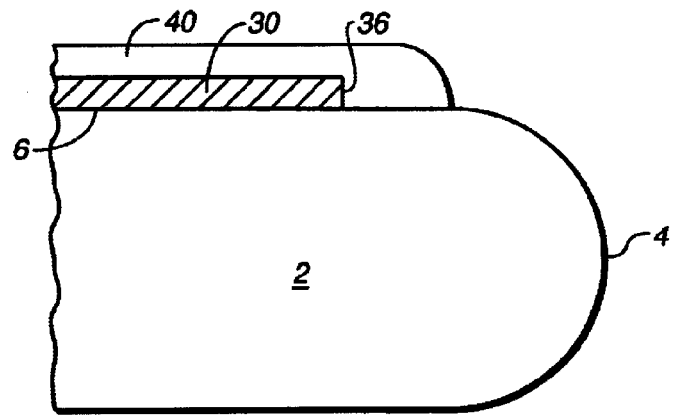
FIG._5
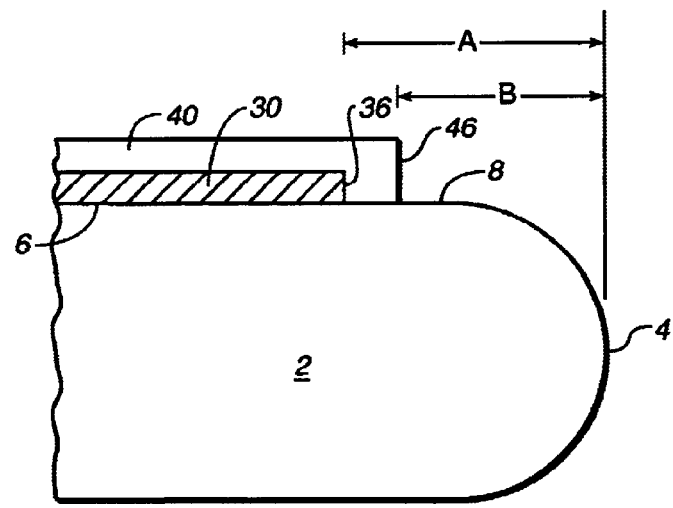
FIG._6

US 6,767,692 B1

PROCESS FOR INHIBITING EDGE PEELING OF COATING ON SEMICONDUCTOR SUBSTRATE DURING FORMATION OF INTEGRATED CIRCUIT STRUCTURE THEREON

BACKGROUND OF THE INVENTION

1. Field of the Invention

This invention relates to the formation of integrated circuit structures. More particularly, this invention relates to inhibition of peeling and resultant particle and/or flake formation at the edge of a semiconductor substrate during formation of a integrated circuit structure thereon.

2. Description of the Related Art

In the formation of integrated circuit structures, multiple layers of electronic structure are formed, including at least one layer of active devices and a plurality of metal interconnect layers. Most, if not all, of the layers involve some sort of patterning using photolithography wherein a layer of photoresist is blanket deposit over the surface of the semiconductor substrate, then exposed to a pattern of light through a reticle, and the exposed portions of the photoresist are removed by a developer solution (when positive resist is used), leaving, in the photoresist layer, an exact replica of the pattern in the reticle.

While such photolithography is in widespread use, it was recognized many years ago that the blanket deposition of photoresist on the upper surface of the substrate, e.g., by spin-on of the photoresist film, resulted in the undesirable formation of particles or flakes when the end edge of the substrate was grasped either manually or by mechanical means during further steps such as metal deposition processes/thermal cycles, either to move the substrate or to secure it during processing.

This problem of particle/flake formation was addressed in Allen U.S. Pat. No. 4,518,678 which proposed to form a photoresist-free lip on the upper surface of the substrate adjacent the end edge of the substrate by directing a stream of a solvent for the photoresist against the end edge of the substrate.

It was also recognized in the prior art that in the practice of photolithography, one could not tolerate exposure of the photoresist to a reflected beam of the pattern of light from the reticle since the reflected light usually was reflected back into the photoresist at an oblique angle rather than at 180°, thus destroying the sharpness of the light image formed in the photoresist.

This resulted in the practice of providing an antireflective surface directly beneath the photoresist layer to prevent reflection back through the photoresist of the pattern of light originally projected onto the photoresist layer from the reticle.

Since such an antireflective surface was almost always desirable whenever a resist layer was used, opaque coatings became commercially available which, although not photosensitive, were removable by liquid solvents just as the light exposed portions of the photoresist (although the same solvent is not used for both).

Also since the antireflective coating layer (ARC layer), or bottom antireflective coating layer (BARC layer) is the layer beneath the photoresist layer, and it was considered desirable to have the ARC or BARC layer beneath all of the photoresist layer, it became the practice to spin on the ARC/BARC layer to the end edge of the semiconductor substrate and then to remove the portion of the ARC layer adjacent the end edge of the substrate by directing a flow of solvent against the end edge of the ARC layer, i.e., to remove the portion of the ARC layer adjacent the end edge of the substrate by chemical means just as had been previously done with the photoresist layer.

It then became the custom to spin on the photoresist layer over the ARC layer and to expose the outer edge of the photoresist layer to radiation followed by development of the photoresist, resulting in the prior art structure shown in FIG. 1 wherein an ARC layer 10 is formed over a semiconductor substrate or wafer 2, with the edge 14 of ARC layer 10 terminating adjacent end edge 4 of substrate 2; and a photoresist layer 20 formed over ARC layer 10, with an outer edge 24 of photoresist layer 20 terminating a greater distance from end edge 4 of substrate 2.

However, as the sizes of integrated circuit structures continued to shrink and tolerances became smaller and smaller, it became apparent that the unevenness of edge 14 of ARC layer 10, as shown magnified at 16 in FIG. 2, resulting from the solvent spray directed toward the end edge of the substrate, was not satisfactory since particle/flake formation still occurred when wide portions of the resulting uneven edge 16 of ARC layer 10 came into contact with substrate-engaging structures.

SUMMARY OF THE INVENTION

In accord with the invention, a photoresist-free and ARC-free lip on the periphery of the upper surface of a semiconductor substrate adjacent the end edge of the substrate is formed by the steps of:

a) forming an ARC layer on one surface of a semiconductor substrate;

b) chemically treating the ARC layer to chemically terminate the ARC layer a first distance from the end edge of the substrate;

c) forming a photoresist layer over the semiconductor substrate and over the ARC layer thereon; and d) exposing the peripheral portion of the photoresist layer to radiation followed by development of the exposed peripheral portion of the photoresist layer to photolithographically terminate the photoresist layer a second distance from the end edge of the substrate wherein the second distance is smaller than the first distance.

BRIEF DESCRIPTION OF THE DRAWINGS

FIG. 1 is a fragmentary vertical cross-sectional view of a prior art structure showing chemical termination of an antireflective coating (ARC) layer adjacent the end edge of a substrate with a photoresist layer shown terminating a larger distance from the end edge of the substrate.

FIG. 2 is an enlarged fragmentary vertical cross-sectional view of a portion of FIG. 1 showing the ragged edge of the chemically terminated ARC layer on the substrate.

FIG. 3 is a fragmentary vertical cross-sectional view of a substrate with an ARC layer spun onto the upper surface of the substrate.

FIG. 4 is a fragmentary vertical cross-sectional view of the structure of FIG. 3 showing chemical termination of the ARC layer a first distance from the end edge of the substrate.

FIG. 5 is a fragmentary vertical cross-sectional view of the structure of FIG. 4 showing a photoresist layer spun over the upper surface of the substrate and over the ARC layer.

FIG. 6 is a fragmentary vertical cross-sectional view of the structure of FIG. 5 showing the photoresist layer photolithographically terminated a second distance from the end edge of the substrate which is smaller than the first distance.

DETAILED DESCRIPTION OF THE INVENTION

The invention comprises a process for forming a photoresist-free and ARC-free lip on the periphery of the upper surface of a semiconductor substrate adjacent the end edge of the substrate by the steps of:

a) forming an ARC layer on one surface of a semiconductor substrate;

b) chemically treating the ARC layer to chemically terminate the ARC layer a first distance from the end edge of the substrate;

c) forming a photoresist layer over the semiconductor substrate and over the ARC layer thereon; and d) exposing the peripheral portion of the photoresist layer to radiation followed by development of the exposed peripheral portion of the photoresist layer to photolithographically terminate the photoresist layer a second distance from the end edge of the substrate wherein the second distance is smaller than the first distance.

The process of the invention is useful for any photolithographic process using an antireflective coating and a photoresist layer for the formation of integrated circuit structures including, but not limited to, patterning of metal or polysilicon for the formation of lines, via and contact openings, islands, and for implanting.

As illustrated in FIG. 6, the term "end edge of the substrate" and similar expressions are intended to define any point at the circular edge of the substrate at which a line at a tangent with the circular edge of the substrate is perpendicular to a line lying in the plane of the substrate.

Turning to FIG. 3, a fragmentary portion of a semiconductor substrate 2 is shown having spun over its upper surface 6 thereof an antireflective coating (ARC) layer 30. Such ARC coating materials are commercially available, for example, from the Brewer Science Company under the trademark DUV 44. In accordance with the invention a stream of solvent for ARC layer 30 is directed toward the periphery of ARC layer 30 on front surface 6 of substrate 2, as generally shown pictorially at 38 in FIG. 3. Apparatus (tools) equipped to provide such a spray through an adjustable nozzle is commercially available, for example, from the TEL/DNS Company under the trademarks ACT-8, 80B, 200W.

The result is the chemically formed edge 36 of ARC layer 30 of FIG. 4 which, it will be noted, is terminated a larger distance from end edge 4 of substrate 2 than edge 14 of prior art ARC layer 10 of FIG. 1. Although chemically formed edge 36 of ARC layer 30 is shown as a smooth surface in FIG. 4, it will be appreciated that since ARC layer 30 was chemically terminated, the surface of edge 36 will be uneven, similar to surface 16 of layer 10 shown in prior art FIG. 2. However, as will be described below, unlike the process of the prior art, formation of uneven side edge 36 on ARC layer 30, by use of chemical termination of ARC layer 30 does not increase the likelihood of particle or flake formation during subsequent processing of substrate 2.

In accordance with the invention, a photoresist layer 40 is then spun over upper surface 6 of substrate 2, completely covering ARC layer 30, as shown in FIG. 5. The peripheral portion of photoresist layer 40 is then photolithographically terminated and removed by exposing the peripheral portion of photoresist layer 40 to a radiation pattern which exposes only this peripheral portion of photoresist layer 40 to such radiation, followed by development of such exposed portion of photoresist layer 40. Since edge 46, unlike edge 36, is photolithographically formed, the result is a precise, accurate, and smooth surface comprising edge 46, thus avoiding the problems of the prior art with respect to particle/flake formation. Apparatus or tools which permit such accurate photolithographic patterning of the peripheral portion of photoresist layer 40 is commercially available from the TEL/DNS Company under the trademarks ACT-8, 80B, 200W.

Relative Distances of A and B from End Edge of Substrate

As seen in FIG. 6, the peripheral portion of photoresist layer 40 is terminated photolithographically to form an end edge 46 closer to end edge 6 of substrate 2 than end 36 of chemically terminated ARC layer 30 so that the rough edge surface of end edge 36 of chemically terminated ARC layer 30 is completely covered by photoresist layer 40. FIG. 6 shows that the distance A from end edge point 4 on substrate 2 to the chemically formed end 36 of ARC layer 30 exceeds distance B from end edge 4 of substrate 2 to photolithographically formed edge 46 of photoresist layer 40 by an amount A minus B.

Maximum Distance of A

Since stepper apparatus used to subsequently process photoresist layer 40 photolithographically does so to within 3 millimeters (mm) of end edge 4 of substrate 2, it is important that the maximum value of A be less than 3 mm (to ensure that there is an antireflective surface beneath any portions of photoresist layer 40 exposed to radiation from the stepper apparatus). Thus, for example, when substrate 2 is a 200 mm diameter semiconductor wafer, the minimum diameter of ARC layer 30 thereon (after chemical formation of edge 36) should be greater than 194 mm, i.e., a minimum radius of ARC layer of greater than 97 mm.

Maximum Distance of B

Furthermore, to ensure that there is sufficient distance between edge 46 of photoresist layer 40 and edge 36 of ARC layer 30 to permit formation of the desired accurate photolithographically-formed edge 46 on photoresist layer 40, the maximum value of B should be at least about 0.5 mm less than A. That is, A minus B should equal at least 0.5 mm. Therefore, for the above 200 mm semiconductor wafer, the diameter of photoresist layer 40 thereon (after photolithographical formation of edge 46) should be greater than 195 mm, i.e., a radius of greater than 97.5 mm.

Minimum Distances of A and B

However, to permit adequate area for peripheral grasping of substrate 2 without risking flaking of photoresist material, the minimum value of B should be at least 1 mm. For the above example of a 200 mm semiconductor wafer, the diameter of photoresist layer 40 on the wafer (after photolithographical formation of edge 46) should not exceed 198 mm. The minimum value of A then should be at least 1 mm+at least 0.5 mm for a total of at least 1.5 mm, The maximum diameter of the ARC layer, in the above example, would then be 197 mm.

The result is a photoresist layer-free and ARC layer-free peripheral upper surface 8 on substrate 2 bounded by a smooth and accurate sidewall 46 on photoresist layer 40 due to the photolithographic termination of the outer perimeter of photoresist layer 40. Particle/flake formation, caused by engagement of this smooth outer surface 8 of substrate 2 with substrate handling apparatus, is thereby inhibited if not completely eliminated by the process of the invention.

Having thus described the invention what is claimed is:

1. A process for formation of a photoresist-free and antireflective coating (ARC)-free peripheral upper surface portion of a semiconductor substrate adjacent the end edge of said substrate by the steps of:

a) forming an ARC layer on said upper surface portion of said semiconductor substrate;

b) chemically treating said ARC layer to chemically terminate said ARC layer a first distance from the end edge of said substrate, leaving said ARC layer on said upper surface of said semiconductor substrate with a chemically formed uneven end edge thereon;

c) forming a photoresist layer over said semiconductor substrate and over said ARC layer thereon to completely cover said chemically formed uneven end edge of said ARC layer;

d) exposing said photoresist layer to a radiation pattern from above said photoresist layer which exposes only the peripheral portion of said photoresist layer larger than said chemically treated ARC layer, followed by;

e) developing said exposed peripheral portion of said photoresist layer to remove said exposed peripheral portions of said photoresist layer, and thereby photolithographically terminating said photoresist layer a second distance from said end edge of said substrate wherein said second distance from said end edge of said substrate is smaller than said first distance, from said end edge of said substrate;

whereby said remaining photoresist layer still completely covers said chemically formed uneven edge of said chemically terminated ARC layer.

2. The process of claim 1 wherein said first distance is at least 1.5 mm from said end edge of said substrate.

3. The process of claim 1 wherein said first distance is less than 3 mm from said end edge of said substrate.

4. The process of claim 2 wherein said second distance is at least 1 mm from said end edge of said substrate.

5. The process of claim 1 wherein said second distance is no greater than at least 0.5 mm less than said first distance.

6. The process of claim 1 wherein said first distance ranges from at least 1.5 mm to less than 3 mm.

7. The process of claim 1 wherein said second distance ranges from at least 1 mm to no greater than 0.5 mm less than said first distance.

8. A process for formation of a photoresist-free and antireflective coating (ARC)-free peripheral upper surface portion of a semiconductor substrate adjacent the end edge of said substrate by the steps of:

a) forming an ARC layer on one surface of said semiconductor substrate;

b) chemically treating said ARC layer with a solvent for said ARC layer to chemically terminate said ARC layer, and to chemically form an uneven end edge on said ARC layer a first distance of at least 1.5 mm from the end edge of said substrate;

c) forming a photoresist layer over said semiconductor substrate and completely over said ARC layer thereon to completely cover said ARC coating and said chemically formed uneven end edge of sid ARC layer;

d) exposing the peripheral portion of said photoresist layer larger than said chemically formed uneven end edge of said ARC layer to a pattern of radiation; and then;

e) developing said exposed peripheral portion of said photoresist layer to photolithographically terminate said photoresist layer a second distance of at least 1 mm from said end edge of said substrate wherein said second distance is smaller than said first distance.

9. The process of claim 8 wherein said first distance is less than 3 mm from said end edge of said substrate.

10. The process of claim 8 wherein said second distance is no greater than at least 0.5 mm less than said first distance.

11. A process for formation of a photoresist-free and antireflective coating (ARC)-free peripheral upper surface portion of a semiconductor substrate adjacent the end edge of said substrate by the steps of:

a) forming an ARC layer on one, surface of a semiconductor substrate;

b) chemically treating said ARC layer with a solvent for said ARC layer to chemically terminate said ARC layer and to chemically form an uneven end edge on said ARC layer a first distance of at least 1.5 mm but less than 3 mm from the end edge of said substrate;

c) forming a photoresist layer over said semiconductor substrate and over said ARC layer thereon; on to completely cover said ARC coating and said chemically formed uneven end edge of sid ARC layer;

d) exposing the peripheral portion of said photoresist layer to a pattern of radiation; and e) developing said exposed peripheral portion of said photoresist layer to photolithographically terminate said photoresist layer a second distance of at least 1 mm, but no greater than at least 0.5 mm less than said first distance, from said end edge of said substrate wherein said second distance is smaller than said first distance and said chemically formed uneven end edge of said ARC layer remains completely covered by said photoresist layer.

12. The process of claim 11 wherein said end edge of said substrate defines any point at the circular edge of said substrate at which a line at a tangent with said circular edge of said substrate is perpendicular to a line lying in the plane of said substrate.

* * * * *